(12) United States Patent
Negishi (10) Patent No.: US 8,089,777 B2
(45) Date of Patent: Jan. 3, 2012

(54) SEMICONDUCTOR DEVICE HAVING SEMICONDUCTOR STRUCTURE BODIES ON UPPER AND LOWER SURFACES THEREOF, AND METHOD OF MANUFACTURING THE SAME

(75) Inventor: Yuji Negishi, Kunitachi (JP)

(73) Assignee: Casio Computer Co., Ltd., Tokyo (JP)

( * ) Notice: Subject to any disclaimer, the term of this patent is extended or adjusted under 35 U.S.C. 154(b) by 973 days.

(21) Appl. No.: 12/042,427

(22) Filed: Mar. 5, 2008

(65) Prior Publication Data

US 2008/0239686 A1 Oct. 2, 2008

(30) Foreign Application Priority Data

Mar. 9, 2007 (JP) ................................ 2007-059482

(51) Int. Cl.
*H05K 7/02* (2006.01)
*H01L 21/50* (2006.01)
(52) U.S. Cl. . 361/783; 361/790; 361/795; 257/E23.003; 257/E21.499
(58) Field of Classification Search .................. 361/783, 361/790, 795; 257/E23.003, E21.499
See application file for complete search history.

(56) References Cited

U.S. PATENT DOCUMENTS

| | | | | |
|---|---|---|---|---|
| 6,545,354 | B1* | 4/2003 | Aoki et al. | 257/734 |
| 6,870,256 | B2* | 3/2005 | Aoki et al. | 257/700 |
| 6,882,054 | B2* | 4/2005 | Jobetto | 257/759 |
| 7,030,494 | B2* | 4/2006 | Aoki | 257/758 |
| 7,192,805 | B2* | 3/2007 | Jobetto | 438/114 |
| 7,279,750 | B2* | 10/2007 | Jobetto | 257/347 |
| 7,368,813 | B2* | 5/2008 | Wakisaka et al. | 257/690 |
| 7,547,967 | B2* | 6/2009 | Jobetto et al. | 257/734 |
| 7,618,886 | B2* | 11/2009 | Jobetto et al. | 438/613 |
| 7,719,116 | B2* | 5/2010 | Wakabayashi et al. | 257/773 |
| 2001/0026010 | A1 | 10/2001 | Horiuchi et al. | |

(Continued)

FOREIGN PATENT DOCUMENTS

EP 1 137 066 A2 9/2001

(Continued)

OTHER PUBLICATIONS

International Search Report and Written Opinion of the International Searching Authority dated Mar. 10, 2009 in corresponding International Application No. PCT/JP2008/054235.

(Continued)

*Primary Examiner* — Anatoly Vortman
(74) *Attorney, Agent, or Firm* — Holtz, Holtz, Goodman & Chick, PC (57) ABSTRACT

A semiconductor device includes an upper circuit board which has a plurality of upper-layer wirings including a plurality of first upper-layer wirings, and has a plurality of first and second lower-layer wirings. A first semiconductor structure body is provided on an upper side of the upper circuit board and is electrically connected to the first upper-layer wirings. A lower circuit board which is provided on a peripheral part of a lower side of the upper circuit board, the lower circuit board including a plurality of external connection wirings that are electrically connected to the second lower-layer wirings, and an opening portion which exposes the first lower-layer wirings. A second semiconductor structure body which is disposed in the opening portion of the lower circuit board, second semiconductor structure body including a plurality of external connection electrodes that are electrically connected to the first lower-layer wirings of the upper circuit board.

9 Claims, 8 Drawing Sheets

U.S. PATENT DOCUMENTS

| | | | |
|---|---|---|---|
| 2003/0038331 A1* | 2/2003 | Aoki et al. | 257/459 |
| 2004/0021210 A1 | 2/2004 | Hosomi | |
| 2004/0094841 A1* | 5/2004 | Matsuzaki et al. | 257/758 |
| 2004/0124547 A1* | 7/2004 | Jobetto | 257/791 |
| 2004/0245614 A1* | 12/2004 | Jobetto | 257/678 |
| 2005/0140021 A1* | 6/2005 | Wakisaka et al. | 257/777 |
| 2006/0249838 A1 | 11/2006 | Liao et al. | |

FOREIGN PATENT DOCUMENTS

| | | |
|---|---|---|
| EP | 1 387 403 A2 | 2/2002 |
| JP | 2001-339011 A | 12/2001 |
| JP | 2004-064043 A | 2/2004 |
| WO | WO 2004/006333 A1 | 1/2004 |

OTHER PUBLICATIONS

Japanese Office Action dated Sep. 7, 2010 (and English translation thereof) in counterpart Japanese Application No. 2007-059482.

* cited by examiner

SEMICONDUCTOR DEVICE HAVING SEMICONDUCTOR STRUCTURE BODIES ON UPPER AND LOWER SURFACES THEREOF, AND METHOD OF MANUFACTURING THE SAME

CROSS-REFERENCE TO RELATED APPLICATIONS

This application is based upon and claims the benefit of priority from prior Japanese Patent Application No. 2007-059482, filed Mar. 9, 2007, the entire contents of which are incorporated herein by reference.

BACKGROUND OF THE INVENTION

1. Field of the Invention

The present invention relates to a semiconductor device having semiconductor structure bodies on its upper and lower surfaces, and a method of manufacturing the semiconductor device.

2. Description of the Related Art

A conventional semiconductor device, which is disclosed in Jpn. Pat. Appln. KOKAI Publication No. 2001-339011, has such a structure that a semiconductor structure body including a semiconductor substrate and a plurality of external connection terminals provided under the semiconductor substrate, is mounted on a base board by a face-down method. In this case, the external connection electrodes of the semiconductor structure body which is mounted on the base board, are connected to lower-layer wirings provided on a lower surface of the base board, through vertical conductors formed in the substrate. The lower surfaces of the base board and the lower-layer wirings are provided with an overcoat film having opening portions at parts corresponding to connection pad portions of the lower-layer wirings. Solder balls are provided in the opening portions of the overcoat film and under the opening portions, and are connected to the connection pad portions of the lower-layer wirings.

In the above-described conventional semiconductor device, the solder balls are bonded to connection terminals which are provided on a main circuit board (motherboard). Thereby, the semiconductor device is mounted on the main circuit board.

In many cases, a plurality of electronic components, including other semiconductor structure bodies and chip components, are mounted on the main circuit board. In such a case, the size of the main circuit board becomes relatively large.

In the meantime, in order to reduce the size of the main circuit board, it is thinkable to mount such electronic components, including other semiconductor structure bodies and chip components, under the base board of the conventional semiconductor device. In this type of semiconductor device, in order to bond the solder balls, which are provided under the base board, to the connection terminals on the main circuit board, it is necessary to make the height of each solder ball greater than the height of the electronic components mounted under the base board, and there is such a problem that the diameter of the solder ball increases, the pitch of arrangement of solder balls increases, and the reduction in pitch is limited.

BRIEF SUMMARY OF THE INVENTION

The object of the present invention is to provide a semiconductor device and a method of manufacturing the semiconductor device, which can reduce the pitch of arrangement of connection pad portions of external connection wirings which are provided under a base board, even if a semiconductor structure body or the like is mounted under the board.

According to an aspect of the present invention, there is provided a semiconductor device comprising:

an upper circuit board which includes a plurality of upper-layer wirings including a plurality of first upper-layer wirings, and includes a plurality of first and second lower-layer wirings;

a first semiconductor structure body which is provided on an upper side of the upper circuit board and is electrically connected to the first upper-layer wirings;

a lower circuit board which is provided on a peripheral part of a lower side of the upper circuit board, the lower circuit board including a plurality of external connection wirings that are electrically connected to the second lower-layer wirings, and an opening portion which exposes the first lower-layer wirings; and a second semiconductor structure body which is disposed in the opening portion of the lower circuit board, the second semiconductor structure body including a plurality of external connection electrodes that are electrically connected to the first lower-layer wirings of the upper circuit board.

According to another aspect of the invention, there is provided a method of manufacturing a semiconductor device, comprising:

preparing an upper circuit board including upper-layer wirings and lower-layer wirings;

preparing a lower circuit board which includes external connection wirings that are connected to parts of the lower-layer wirings and have connection pad portions, and includes an opening portion which exposes other parts of the lower-layer wirings;

integrally providing the lower circuit board on a lower surface of the upper circuit board such that the external connection wirings are connected to parts of the lower-layer wirings of the upper circuit board;

mounting a first semiconductor structure body on the upper circuit board and connecting the first semiconductor structure body to the upper-layer wirings; and mounting a second semiconductor structure body in the opening portion of the lower circuit board such that the second semiconductor structure body is connected to other parts of the lower-layer wirings.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1A:
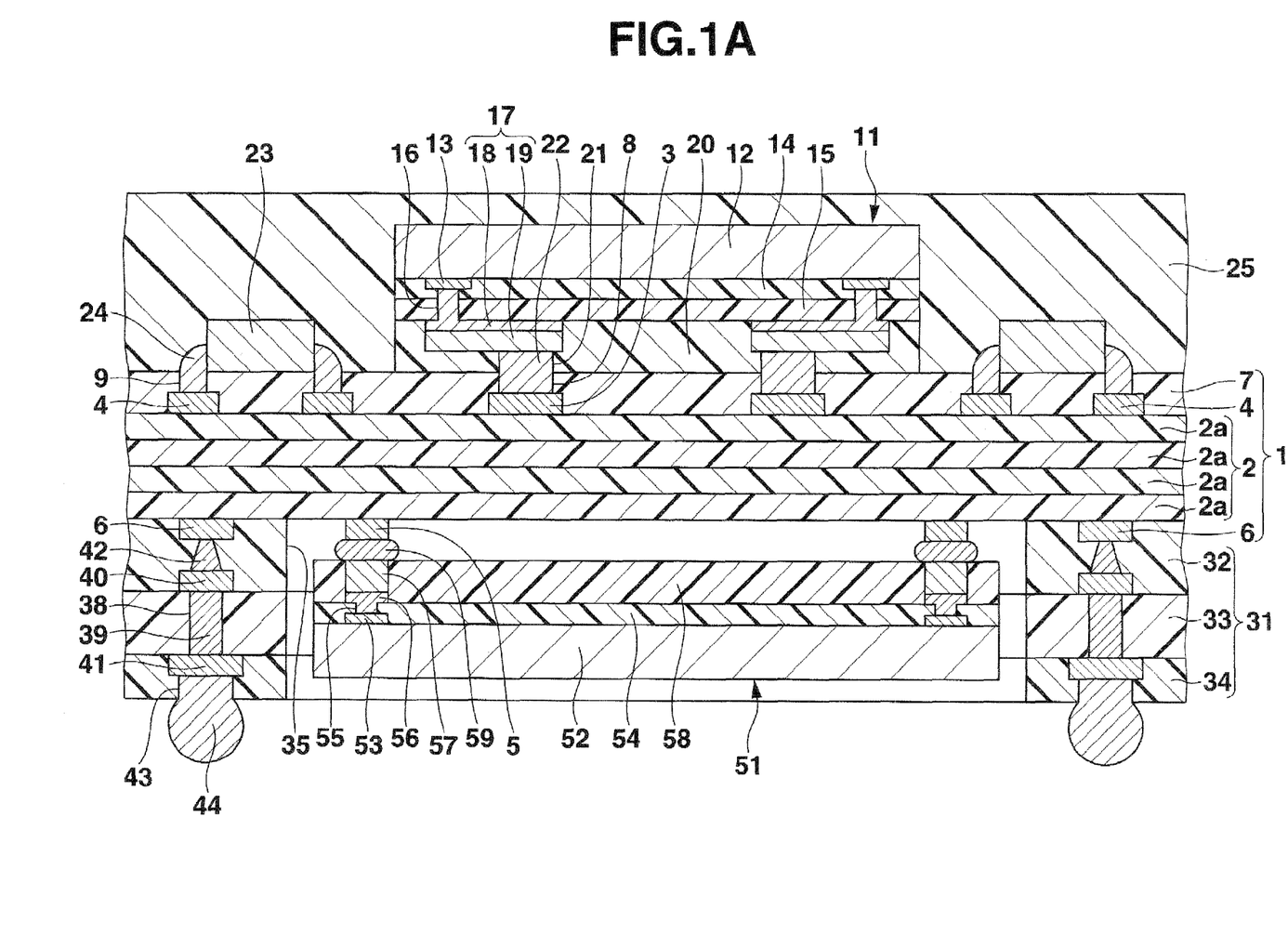
FIG. 1A is a cross-sectional view of a semiconductor device according to an embodiment of the present invention.

FIG. 1A is a cross-sectional view showing a semiconductor device according to an embodiment of the present invention. The semiconductor device includes an upper circuit board 1 having a rectangular shape in plan. The upper circuit board 1 includes a multilayer wiring board 2 having a multilayer wiring structure in which a plurality (four in FIG. 1A, but the number is not limited to four) of laminated substrates 2a, each being formed of a thermosetting organic resin material in which a reinforcement material, such as glass fibers, is mixed. As shown in an enlarged view of FIG. 1B, the multilayer wiring board 2 has a well-known structure in which internal wirings 2a1, which are provided between the adjacent substrates 2a, are electrically connected to each other via via-holes 2a2, which vertically penetrate the respective substrates 2a, so as to constitute a predetermined circuit. A plurality of first upper-layer wirings 3 having connection pad portions are provided on a central part of an upper surface of the multilayer wiring board 2, and a plurality of second upper-layer wirings 4 having connection pad portions are provided on a peripheral part of the upper surface of the multilayer wiring board 2. A plurality of first lower-layer wirings 5 having connection pad portions are provided on a central part of a lower surface of the multilayer wiring board 2, and a plurality of second lower-layer wirings 6 having connection pad portions are provided on a peripheral part of the lower surface of the multilayer wiring board 2. The wirings 3 to 6 are formed of, e.g. copper foils or aluminum foils.

Figure 1B:
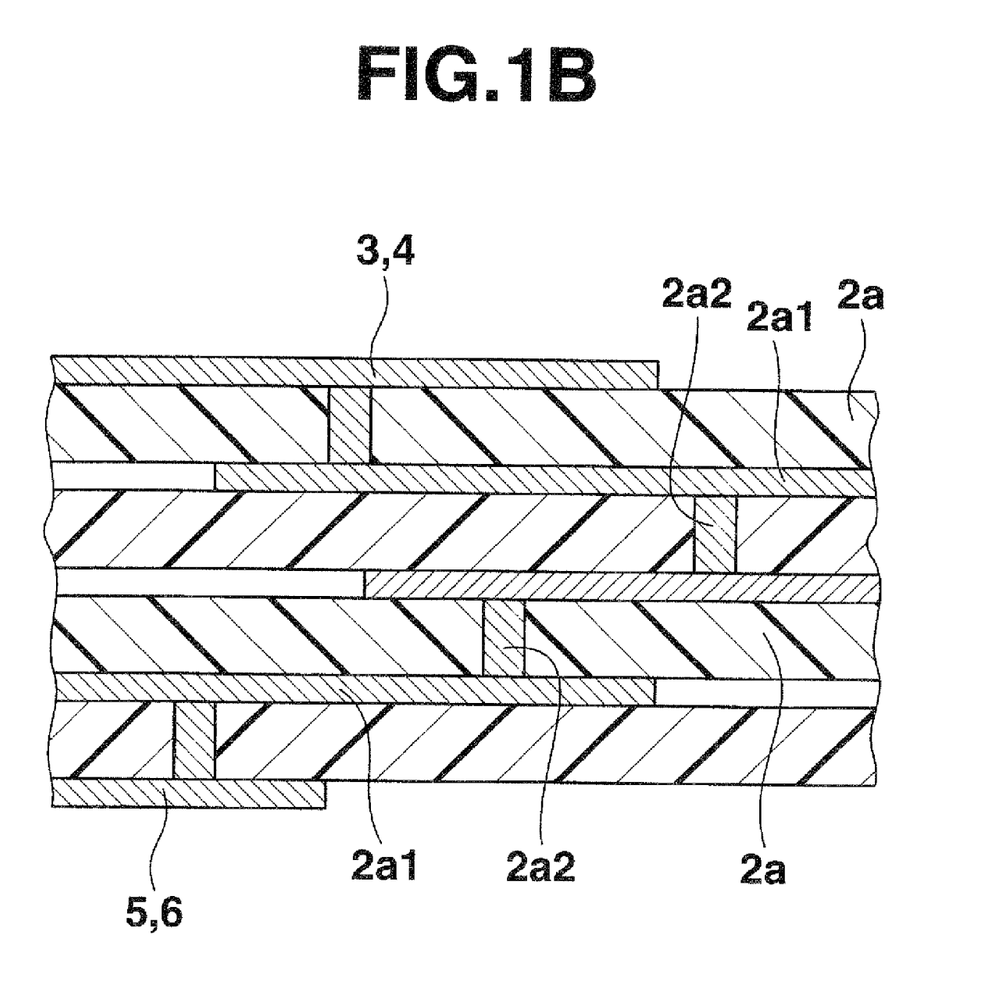
FIG. 1B is an enlarged cross-sectional view for describing in detail an upper circuit board of the semiconductor device shown in FIG. 1A.

The first and second upper-layer wirings 3 and 4 and the first and second lower-layer wirings 5 and 6 are electrically connected via the internal wirings 2a1 and via-holes 2a2 in the multilayer wiring board 2 so as to constitute a predetermined circuit. An upper-layer insulation film 7, which is formed of, e.g. a solder resist, is provided on upper surfaces of the first and second upper-layer wirings 3 and 4, and the multilayer wiring board 2. First and second opening portions 8 and 9 are formed in those parts of the upper-layer insulation film 7, which correspond to the connection pad portions of the first and second upper-layer wirings 3 and 4.

A first semiconductor structure body 11 having a rectangular shape in plan is mounted on a substantially central part of the upper surface of the upper-layer insulation film 7 of the upper circuit board 1. The semiconductor structure body 11 includes a silicon substrate (semiconductor substrate) 12. An integrated circuit (not shown) having a predetermined function is provided on a lower surface of the silicon substrate 12, and a plurality of connection pads 13 which are formed of, e.g. aluminum-based metal are provided on a peripheral part of the lower surface of the silicon substrate 12 and are electrically connected to the integrated circuit. An insulation film 14 which is formed of an inorganic material such as silicon oxide, is provided on lower surfaces of the connection pad 13 excluding their central parts, and on the lower surface of the silicon substrate 12. An electrically insulative protection film 15 which is formed of an organic material such as polyimide resin is provided on the lower surface of the insulation film 14. The central parts of the connection pads 13 are exposed via opening portions 16 which are formed in the insulation film 14 and protection film 15.

Wirings 17 are provided on the lower surface of the protection film 15. Each wiring 17 has a two-layer structure comprising an underlying metal layer 18 which is formed of, e.g. copper on the lower surface of the protection film 15, and an overlying metal layer 19 which is formed of, e.g. copper on the lower surface of the underlying metal layer 18. One end portion of the wiring 17 is electrically connected to the connection pad 13 via the opening potion 16 in the insulation film 14 and protection film 15. An overcoat film 20 which is formed of, e.g. a solder resist is provided on the lower surfaces of the wirings 17 and protection film 15. Opening portions 21 are formed in the overcoat film 20 at parts corresponding to the connection pad portions of the wirings 17.

The connection pad portions of the wirings 17 of first semiconductor structure body 11 are bonded to the connection pad portions of the first upper-layer wirings 3 of the circuit board 1 via solder layers 22 which are provided in the opening portions 21 of the overcoat film 20 and in the first opening portions 8 of the upper-layer insulation film 7 of the circuit board 1. Thereby, the first semiconductor structure body 11 is mounted on the central part of the upper surface of the upper-layer insulation film 7 of the circuit board 1 by a face-down method.

A plurality of passive-type chip components 23, which are composed of capacitors, resistors, etc., are mounted on a peripheral part of the upper surface of the upper-layer insulation film 7 of the upper circuit board 1. Both electrodes (not shown) of the chip component 23 are bonded to the connection pad portions of the second upper-layer wirings 4 of the circuit board 1 via conductive materials 24 such as solder which are provided in second opening portions 9 formed in the upper-layer insulation film 7 of the circuit board 1. Thereby, the chip components 23 are mounted on the peripheral part of the upper surface of the upper-layer insulation film 7 of the circuit board 1. A sealing film 25 which is formed of an organic material such as epoxy resin is provided on the upper surfaces of the first semiconductor structure body 11, chip components 23 and upper-layer insulation film 7 of the circuit board 1.

A lower circuit board 31 of a rectangular frame shape in plane, in which a plurality of rectangular openings are formed in a matrix, is provided on the connection pad portions of the second lower-layer wirings 6 of the circuit board 1 and on the peripheral part of the lower surface of the multilayer wiring board 2. The lower circuit board 31 includes a first lower-layer insulation sheet (lower-layer insulation film) 32, a second lower-layer insulation sheet (lower-layer insulation film) 33 and an overcoat film 34, which are stacked and have rectangular frame shapes. The first and second lower-layer insulation sheets 32 and 33 are formed of a material in which a base material, such as glass cloth, is impregnated with a thermosetting resin that is composed of an organic resin such as epoxy resin. The overcoat film 34 is formed of, e.g. a solder resist. Rectangular opening portions 35 of the same shape and same size are provided in central parts of the first lower-layer insulation sheet 32, second lower-layer insulation sheet 33 and overcoat film 34. The lower circuit board 31 is constituted by closely stacking the first lower-layer insulation sheet 32, second lower-layer insulation sheet 33 and overcoat film 34, with the end portions of their opening portions 35 being aligned.

Through-holes 38 are formed at a plurality of predetermined parts of the second lower-layer insulation sheet 33. A plurality of vertical conduction portions 39, which are formed of, e.g. metal paste or electrically conductive pins, are respectively provided in the through-holes 38. A plurality of sets of a connection pad 40 and external connection wiring 41 which are formed of, e.g. copper foils or aluminum foils, are provided on upper and lower surfaces of the second lower-layer insulation sheet 33. The connection pad 40 and the corresponding external connection wiring 41 of each set are interconnected via the vertical conduction portion 39. Projection electrodes 42 each having a truncated conical shape, are respectively provided on the upper surface of the connection pads 40. The connection pads 40 and projection electrodes 42 are disposed in the first lower-layer insulation sheet 32, and upper end portions of the projection electrodes 42 are respectively connected to lower surfaces of the connection pad portions of the second lower-layer wirings 6 of the circuit board 1.

A plurality of opening portions 43 are formed through the overcoat film 34 at parts corresponding to the connection pad portions of the external connection wirings 41. A plurality of solder balls or conductive solid 44 are provided in the opening portions 43 in the overcoat film 34 and under the opening portions 43 (outwardly extended from the opening portions 43), and are connected to the connection pad portions of the external connection wirings 41.

A second semiconductor structure body 51 is mounted on a central part of the lower surface of the multilayer wiring board 2 of the upper circuit board 1. The structure body 51 is positioned within the opening portions 35 of the first and second lower-layer insulation sheets 32 and 33 of the lower circuit board 31. The second semiconductor structure body 51 includes a silicon substrate (semiconductor substrate) 52. An integrated circuit (not shown) having a predetermined function is provided on the upper surface of the silicon substrate 52. A plurality of connection pads 53 which are formed of, e.g. an aluminum-based metal are provided on a peripheral surface of the upper surface of the silicon substrate 52 and are electrically connected to the integrated circuit. An insulation film 54 which is formed of an inorganic material, such as silicon oxide is provided on the upper surface of the silicon substrate 52 and the connection pads 53 excluding central parts of thereof. The central parts of the connection pads 53 are exposed via opening portions 55 which are formed in the insulation film 54. The insulation film 54 may be formed of a multilayer structure comprising an inorganic insulation film of, e.g. silicon oxide, and an organic insulation film of, e.g. polyimide which is formed on the inorganic insulation film.

A plurality of underlying metal layers 56 which are formed of, e.g. copper are respectively provided on upper surfaces of the connection pads 53. The metal layers 56 are exposed or upwardly projected via the opening portions 55 of the insulation film 54, and on the upper surface of the insulation film 54 therearound. A plurality of projection electrodes (external connection electrodes) 57 which are formed of copper are respectively provided on the entire upper surfaces of the underlying metal layers 56. A sealing film 58 which is formed of an organic material such as epoxy resin is provided on the upper surface of the insulation film 54 around the projection electrodes 57. A plurality of solder balls 59 are provided on the upper surfaces of the projection electrodes 57.

The solder balls 59 are respectively bonded to the connection pad portions of the first lower-layer wirings 5 of the circuit board 1. Thereby, the second semiconductor structure body 51 is mounted on a central part of the lower surface of the multilayer wiring board 2 of the circuit board 1 by a face-down method within the opening portions 35 of the first and second lower-layer insulation sheets 32 and 33 of the lower circuit board 31. In this state, the lower surface of the overcoat film 34 of the lower circuit board 31 is positioned below the lower surface of the silicon substrate 52 of the second semiconductor structure body 51. In other words, the lower surface of the overcoat film 34 of the lower circuit board 31 projects from the circuit board 1, more than the lower surface of the silicon substrate 52 of the second semiconductor structure body 51. Accordingly, the solder balls 44, which are provided under the overcoat film 34, are positioned below the lower surface of the silicon substrate 52 of the second semiconductor structure body 51.

In the above-described semiconductor device, the solder or metal balls 44 are bonded to connection terminals which are provided on the main circuit board (not shown). Thereby, the semiconductor device is mounted on the main circuit board. In this case, since the solder balls 44, which are provided under the overcoat film 34 of the lower circuit board 31, are positioned below the lower surface of the silicon substrate 52 of the second semiconductor structure body 51, the size of each solder ball 44 can sufficiently be reduced. Therefore, despite the second semiconductor structure body 51 being mounted, the pitch of arrangement of the solder balls 44 and the connection pad portions of the external connection wirings 41 can be set at a sufficiently small pitch, and accordingly the size of the entire semiconductor device can be reduced.

In the above-described case, the lower surface of the overcoat film 34 of the lower circuit board 31 is positioned below the lower surface of the silicon substrate 52 of the second semiconductor structure body 51. However, the above-described advantageous effects can be obtained even in the case where the lower surface of the overcoat film 34 of the lower circuit board 31 is positioned on a level with or above the lower surface of the silicon substrate 52 of the second semiconductor structure body 51, provided that the lower surfaces of the solder balls 44, which are bonded to the external terminals and are deformed to non-spherical shapes in this state, are positioned below the lower surface of the second semiconductor structure body 51.

Figure 2:
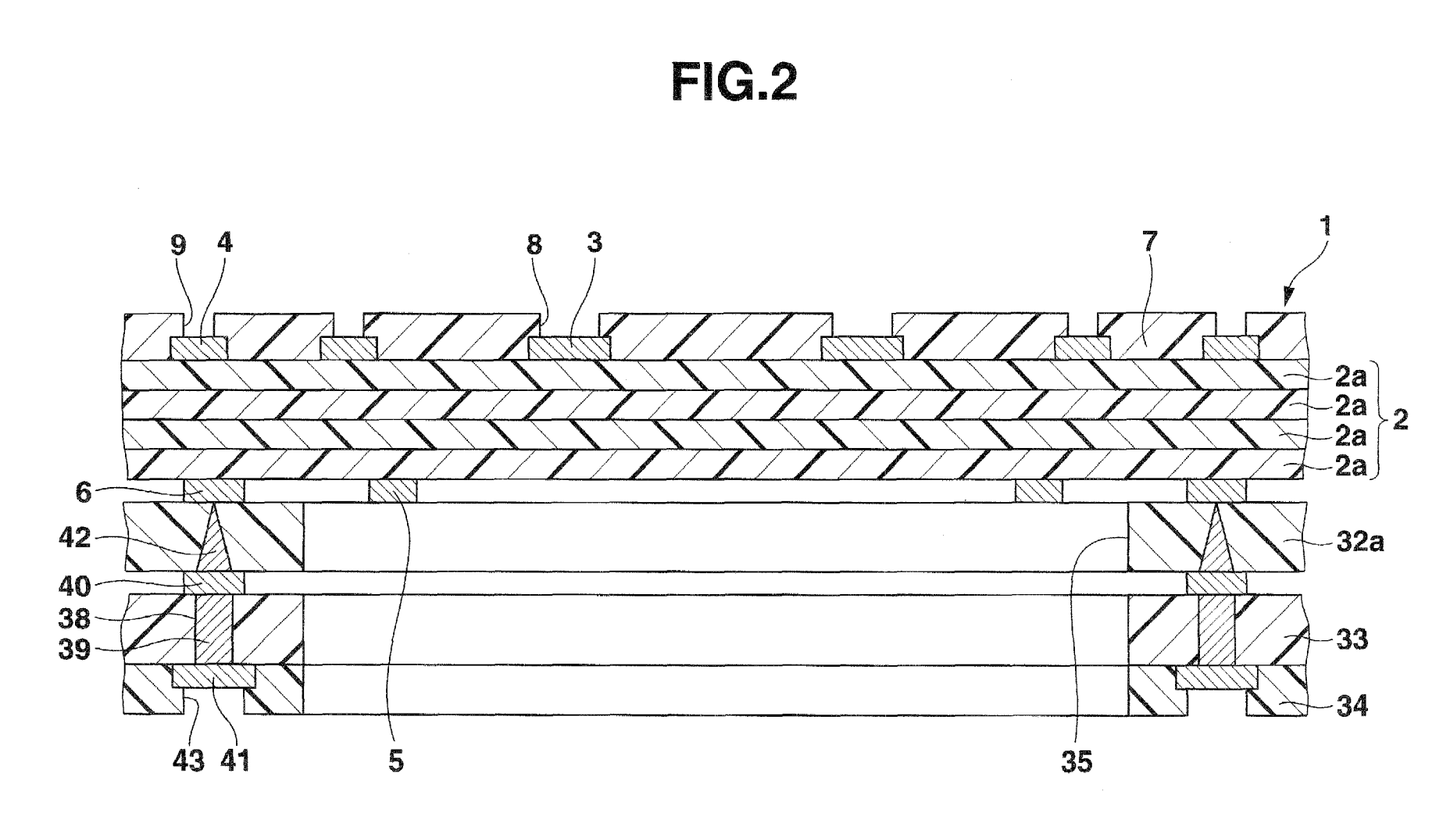
FIG. 2 is a cross-sectional view illustrating an initial fabrication step in an example of a method of manufacturing the semiconductor device shown in FIG. 1A.

Next, an example of the method of manufacturing the above-described semiconductor device is described. To start with, as shown in FIG. 2, an upper circuit board 1, a first lower-layer insulation sheet 32a and a second lower-layer insulation sheet 33 are prepared. In this case, the sizes of the prepared components are determined such that a plurality of semiconductor devices, each of which is completed as shown in FIG. 1, can be formed.

The circuit board 1, as has been described above, includes a multilayer wiring board 2 having a multilayer wiring structure in which a plurality of substrates 2a having internal wirings 2a1 and via-holes 2a2 are stacked. First and second upper-layer wirings 3 and 4 and first and second lower-layer wirings 5 and 6 are formed on the upper and lower surfaces of the multilayer wiring board 2 by patterning, e.g. copper foils which are stacked on the upper and lower surfaces of the multilayer wiring board 2. An upper-layer insulation film 7 is formed on the upper surface of the multilayer wiring board 2 including the first and second upper-layer wirings 3 and 4 by coating, e.g. a solder resist on the upper surface of the multilayer wiring board 2 by means of screen printing or the like. First and second opening portions 8 and 9 are formed by, e.g. laser processing using laser irradiation, in the upper-layer insulation film 7 at parts corresponding to connection pad portions of the first and second upper-layer wirings 3 and 4.

The second lower-layer insulation sheet 33 is formed in the following manner. A base material, such as glass cloth, is impregnated with a thermosetting resin that is composed of, e.g. epoxy resin. The thermosetting resin is cured in a sheet shape. A plurality of rectangular opening portions 35 are formed in the sheet-shaped structure by, for example, punching, and a plurality of through-holes 38 are also formed by, for example, laser processing using laser irradiation.

Vertical conduction portions 39, which are formed of, e.g. metal paste or electrically conductive pins, are provided in the through-holes 38 of the second lower-layer insulation sheet 33. Connection pads 40 and external connection wirings 41 are formed on upper and lower surfaces of the second lower-layer insulation sheet 33 by patterning, e.g. copper foils which stacked on the upper and lower surfaces of the second lower-layer insulation sheet 33, with the connection pads 40 and external connection wirings 41 being interconnected via the vertical conduction portions 39.

Projection electrodes 42 each having a conical shape are provided on the upper surfaces of the connection pads 40 by coating an electrically conductive paste, in which metallic fillers or the like are dispersed in a thermosetting resin, by means of, e.g. screen printing, and curing the electrically conductive paste. An overcoat film 34 having an opening portion 35 is formed on the lower surface of the lower-layer insulation sheet 33 including the external connection wirings 41 by coating, e.g. a solder resist by screen printing or the like. Opening portions 43 are formed in the overcoat film 34 at parts corresponding to connection pad portions of the external connection wirings 41 by means of, e.g. laser processing using laser irradiation.

The first lower-layer insulation sheet 32a is formed in the following manner. A base material, such as glass cloth, is impregnated with a thermosetting resin that is composed of, e.g. epoxy resin. The thermosetting resin is half-cured in a sheet shape. A plurality of rectangular opening portions 35 are formed in the sheet-shaped structure by, for example, punching. In the state in which the first lower-layer insulation sheet 32a is heated, the first lower-layer insulation sheet 32a and the second lower-layer insulation sheet 33 are pressure-bonded and the conical projection electrodes 42 are made to pierce the first lower-layer insulation sheet 32a. Thereby, the first lower-layer insulation sheet 32a is temporarily fixed on the upper side of the second lower-layer insulation sheet 33.

Figure 3:
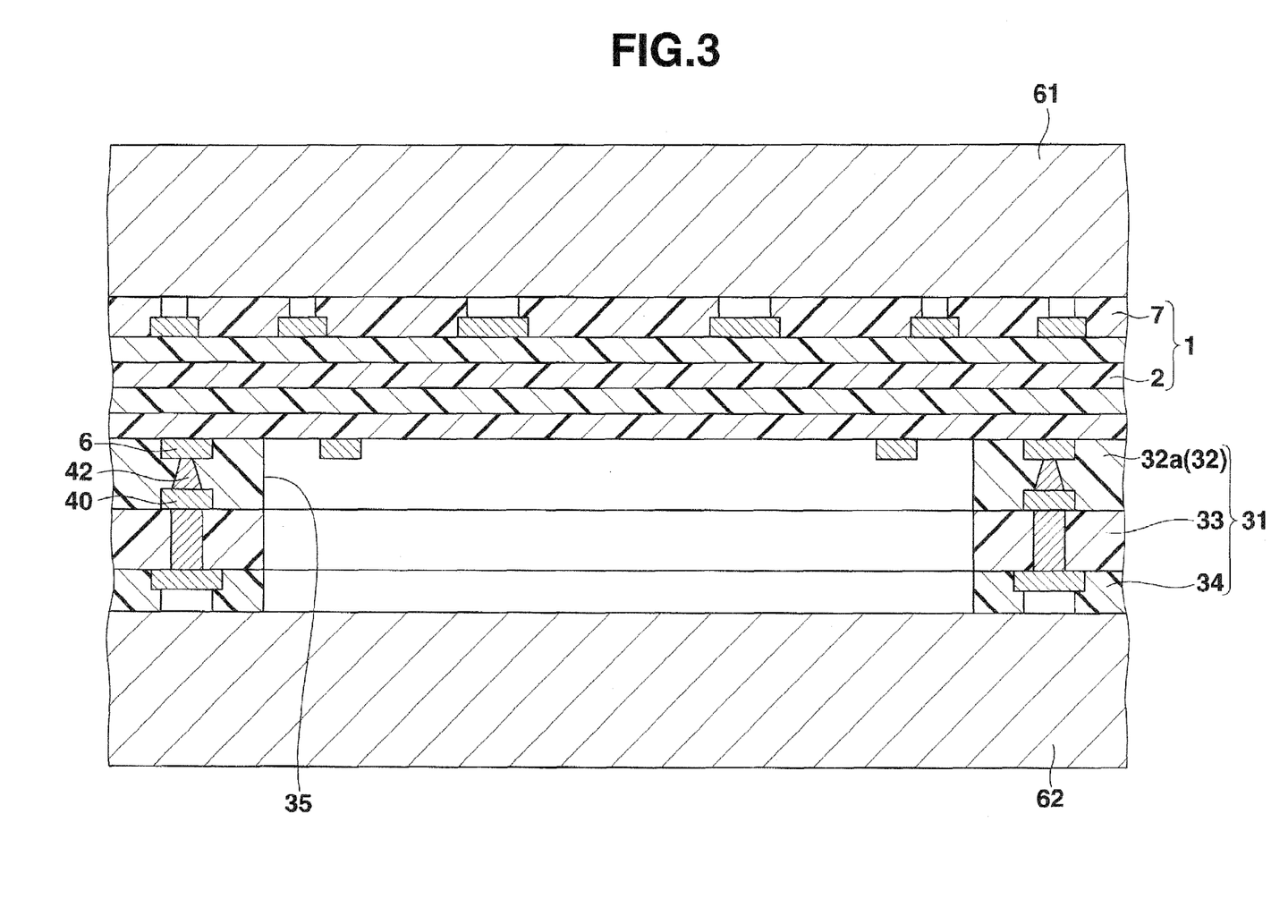
FIG. 3 is a cross-sectional view illustrating a fabrication step following the step illustrated in FIG. 2.

After the above-described structure is prepared, as shown in FIG. 2, the circuit board 1 is, while being aligned by, e.g. pins, disposed on the upper surface of the first lower-layer insulation sheet 32a that is temporarily fixed on the upper side of the second lower-layer insulation sheet 33. Subsequently, as shown in FIG. 3, the first lower-layer insulation sheet 32a is heated and pressed at a temperature, which is a curing temperature or above, from above and below by using a pair of hot-pressing plates 61 and 62.

The first lower-layer insulation sheet 32a is melted by the hot-pressing, and is cured by subsequent cooling. Thus, the first lower-layer insulation sheet 32 is formed on the lower surface of the multilayer wiring board 2 including the connection pad portions of the second lower-layer wirings 6 of the circuit board 1, and the upper surface of the second lower-layer insulation sheet 33 including the connection pads 40 is fixed to the lower surface of the first lower-layer insulation sheet 32. Upper portions of the projection electrodes 42 are pressed on the lower surfaces of the connection pad portions of the second lower-layer wirings 6 and are properly crushed, and the projection electrodes 42 are connected to the lower surfaces of the connection pad portions of the second lower-layer wirings 6. In this state, the lower circuit board 31 having the opening portion 35 is formed on the peripheral part of the lower surface of the circuit board 1.

Figure 4:
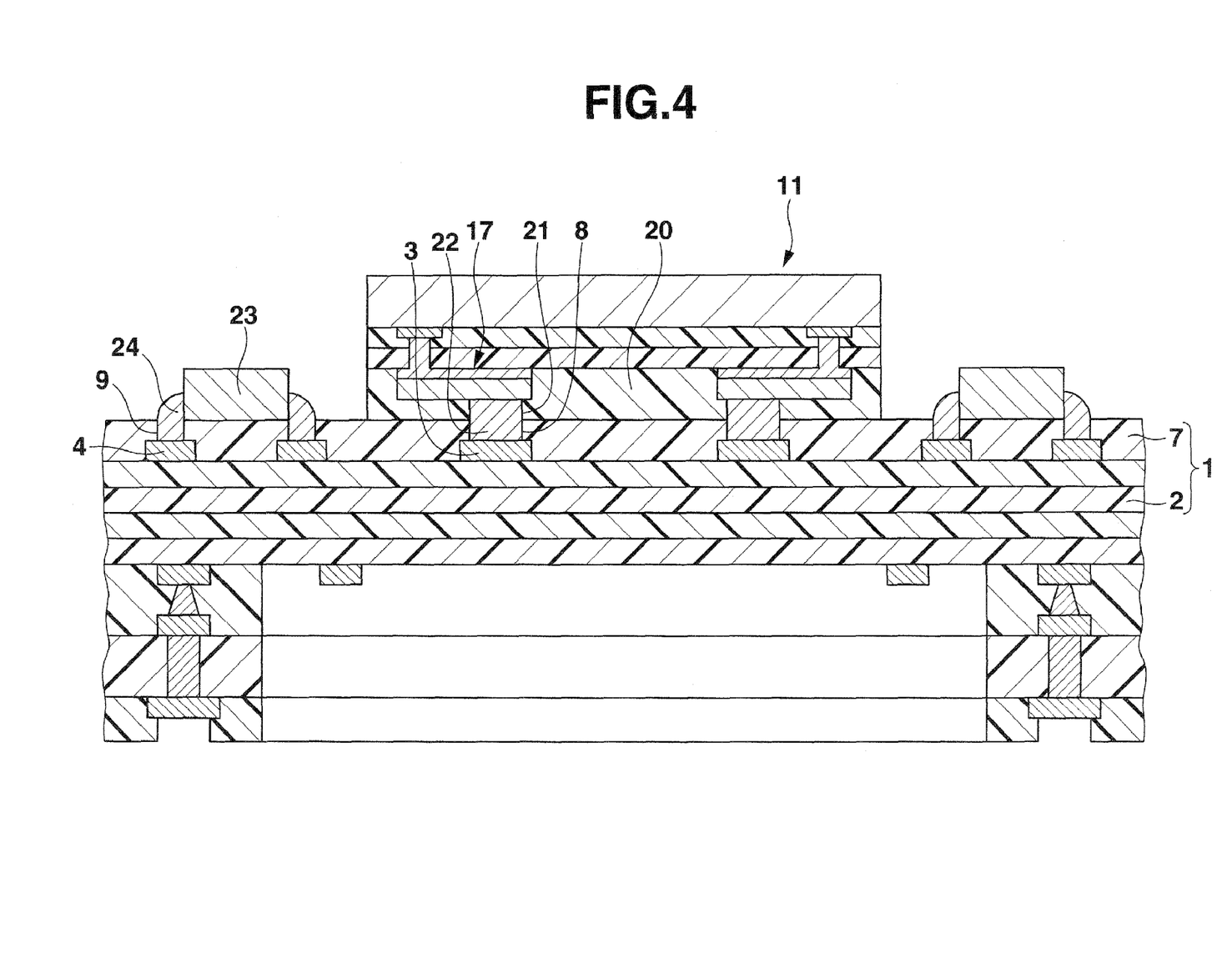
FIG. 4 is a cross-sectional view illustrating a fabrication step following the step illustrated in FIG. 3.

Subsequently, as shown in FIG. 4, a solder layer 22 is printed or coated at the first opening portions 8 of the upper-layer insulation film 7 of the circuit board 1 or at the opening portions 21 of the overcoat film 20 of the first semiconductor structure body 11. Using a proper method such as reflow, the connection pad portions of the wirings 17 of the first semiconductor structure body 11 are bonded to the connection pad portions of the first upper-layer wirings 3 of the circuit board 1. In this manner, the first semiconductor structure body 11 is mounted on the central part of the upper surface of the upper-layer insulation film 7 of the circuit board 1 by a face-down method. In addition, both electrodes (not shown) of the chip component 23 are bonded to the connection pad portions of the second upper-layer wirings 4 of the circuit board 1 via solder 24 which is provided at the second opening portions 9 of the upper-layer insulation film 7 of the circuit board 1. Thereby, the chip component 23 is mounted on the peripheral part of the upper surface of the upper-layer insulation film 7 of the circuit board 1. If the step of mounting the first semiconductor structure body 11 on the circuit board 1 and the step of mounting the chip component 23 on the circuit board 1 are simultaneously carried out by using a reflow method, the efficiency of fabrication is increased.

Figure 5:
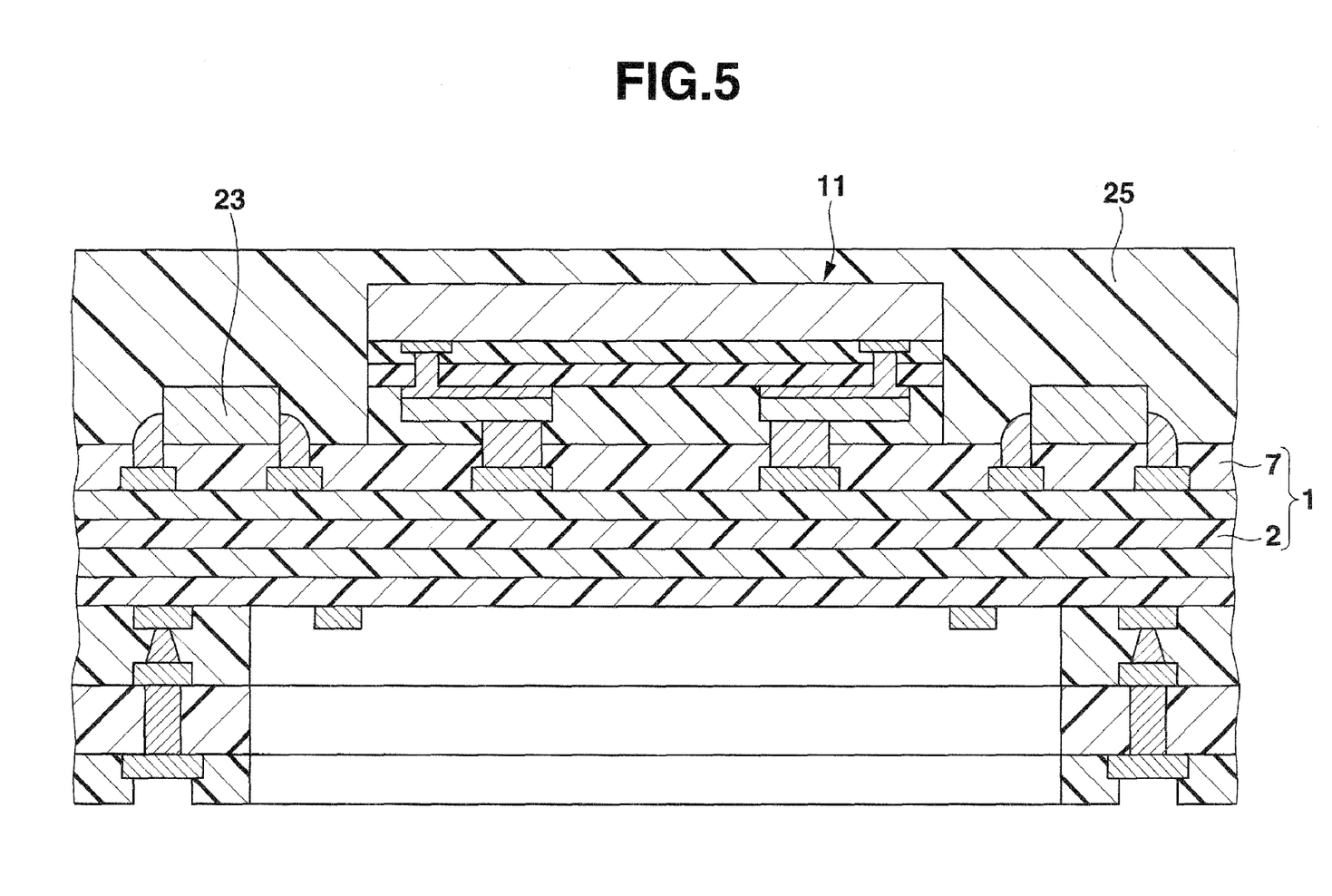
FIG. 5 is a cross-sectional view illustrating a fabrication step following the step illustrated in FIG. 4.
Figure 6:
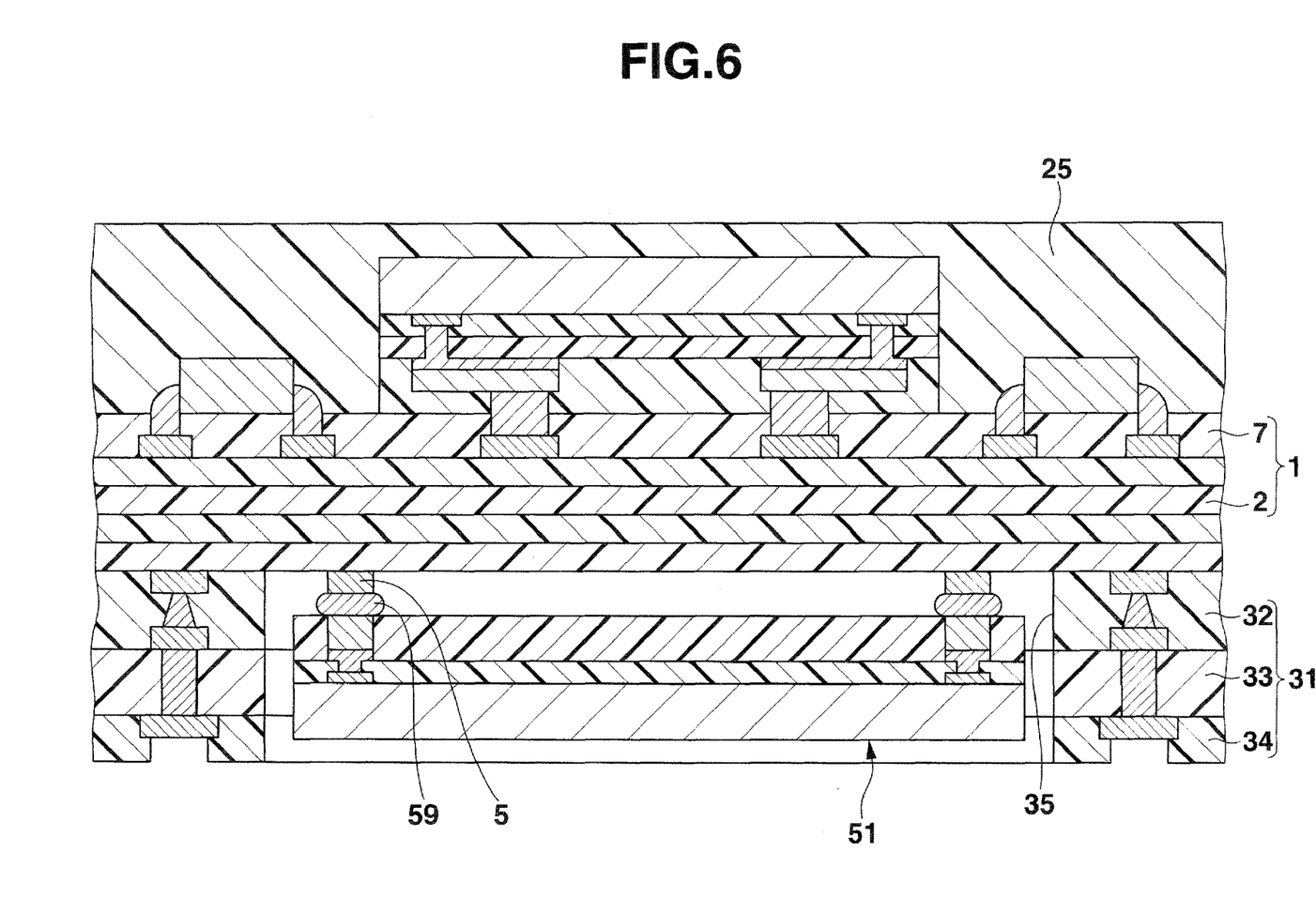
FIG. 6 is a cross-sectional view illustrating a fabrication step following the step illustrated in FIG. 5.

Next, a film of a resin material, such as epoxy resin, is formed by, e.g. a screen printing method or a spin coat method, on the upper surface of the upper-layer insulation film 7 of the circuit board 1 including the first semiconductor structure body 11 and chip components 23. The film of the resin material is cured, and thus a sealing film 25 is formed. Subsequently, as shown in FIG. 6, the solder balls 59 of the second semiconductor structure body 51 are bonded to the connection pad portions of the first lower-layer wirings 5 of the circuit board 1. This bonding can be carried out by positioning the sealing film 25 downward and putting the entire structure in a reflow apparatus in the state in which the solder balls 59 of the second semiconductor structure body 51 are aligned with the connection pad portions of the first lower-layer wirings 5 of the circuit board 1. In this manner, the second semiconductor structure body 51 is mounted by a face-down method on the central part of the lower surface of the multilayer wiring board 2 of the circuit board 1 within the opening portions 35 of the first and second lower-layer insulation sheets 32 and 33 of the lower circuit board 31.

Figure 7:
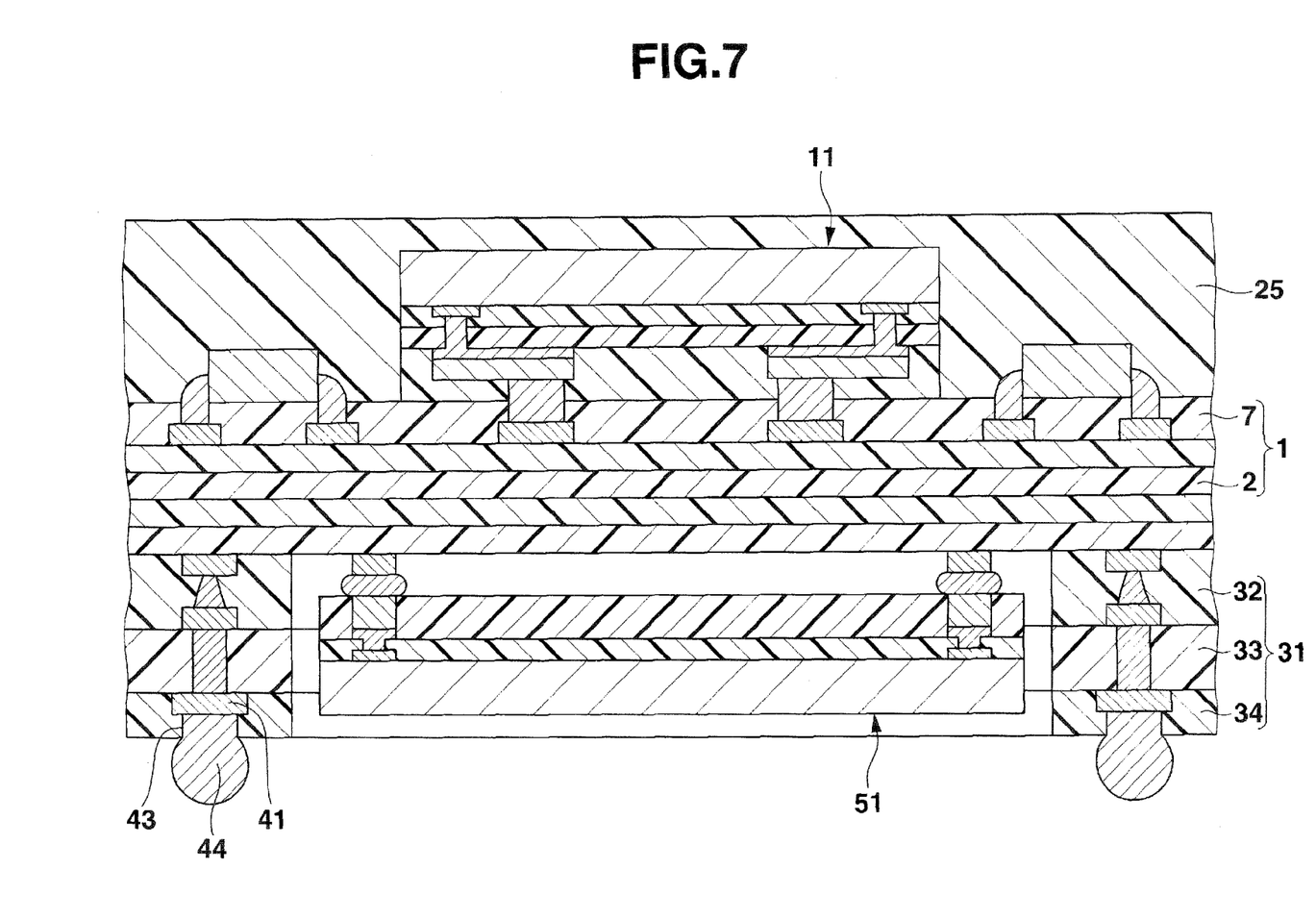
FIG. 7 is a cross-sectional view illustrating a fabrication step following the step illustrated in FIG. 6.

Subsequently, as shown in FIG. 7, solder balls 44 are formed in the opening portions 43 in the overcoat film 34 of the lower circuit board 31 and under the opening portions 43 and are connected to the connection pad portions of the external connection wirings 41. Thereafter, the sealing film 25, circuit board 1 and lower circuit board 31 are diced between neighboring first and second semiconductor structure bodies 11, 51, and a plurality of semiconductor devices, each of which is shown in FIG. 1, are obtained.

In the above-described embodiment, the solder balls 44 are formed under the overcoat film 34 of the lower circuit board 31. However, the solder balls 44 may not necessarily be formed. In an alternative applicable method, for example, a solder layer is coated on connection terminals of the main circuit board, on which the semiconductor device of the present invention is to be mounted. The opening portions 43 of the overcoat film 34 are aligned with, and disposed on, the solder layer. The solder layer is melted by reflow, and is filled in the opening portions 43 so that the solder layer is connected to the external connection wirings 41. In addition, in the above-described embodiment, the opening portions 43, which expose the connection pad portions of the external connection wirings 41, are provided in the overcoat film 34 of the lower circuit board 31, and then the lower circuit board 31 and the circuit board 1 are bonded. In an alternative method, the lower circuit board 31 and the circuit board 1 may be bonded without providing the opening portions 43 which expose the connection pad portions of the external connection wirings 41. In a subsequent proper fabrication step, the opening portions 43, which expose the connection pad portions of the external connection wirings 41, may be provided in the overcoat film 34 of the lower circuit board 31. Besides, in the above-described embodiment, the circuit board 1 and lower circuit board 31 comprise multilayer wiring boards. Alternatively, the multilayer wiring board may be replaced with a single-layer wiring board.

According to the present invention, a lower circuit board having an opening portion is provided under an upper circuit board. A semiconductor structure body is provided under the circuit board within the opening portion of the lower circuit board. External connection wirings are provided on the lower circuit board. Thereby, the pitch of arrangement of connection pad portions of the external connection wirings of the lower circuit board can be set, regardless of the presence/absence of the semiconductor structure body under the circuit board. Moreover, even when the semiconductor structure body is mounted under the circuit board, the pitch of arrangement of connection pad portions of the external connection wirings of the lower circuit board can be decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   an upper circuit board in which a plurality of substrates each including a via-hole and an internal wiring are stacked, the upper circuit board including a plurality of upper-layer wirings on an upper surface thereof and a plurality of lower-layer wirings on a lower surface thereof, the plurality of upper-layer wirings including at least first upper-layer wirings, and the plurality of lower-layer wirings including a plurality of first lower-layer wirings and a plurality of second lower-layer wirings;
   a first semiconductor structure body which is provided on the upper circuit board and is connected to the first upper-layer wirings;
   a lower circuit board which is provided on a peripheral part of a lower side of the upper circuit board, the lower circuit board including a plurality of external connection wirings that are connected to the second lower-layer wirings, and a first opening portion which exposes the first lower-layer wirings and second opening portions which expose the external connection wirings;
   a second semiconductor structure body which is disposed in the first opening portion of the lower circuit board, and which includes external connection electrodes that are connected to the first lower-layer wirings of the upper circuit board; and
   a plurality of conductive solids which are bonded to the external connection wirings via the second opening portions which expose the external connection wirings, each of the conductive solids having a height such that a lower surface of the conductive solid is positioned below a lower surface of the second semiconductor structure body in a state in which the conductive solid is connected to an external terminal;
   wherein the first semiconductor structure body includes a semiconductor substrate having a plurality of connection pads, an insulation film covering the semiconductor substrate and having a plurality of opening portions which expose the connection pads, wirings which are formed on the insulation film and are electrically connected to the connection pads via the opening Portions, and an overcoat film covering the insulation film and including opening portions which expose parts of the wirings.

2. The semiconductor device according to claim 1, wherein the lower circuit board includes another overcoat film including a plurality of opening portions at parts corresponding to connection pad portions of the external connection wirings.

3. The semiconductor device according to claim 1, wherein the plurality of upper-layer wirings include at least one second upper-layer wiring, and the semiconductor device further comprises a chip component which is electrically connected to the second upper-layer wiring.

4. The semiconductor device according to claim 3, further comprising a second sealing film which is provided on the chip component and the upper circuit board.

5. The semiconductor device according to claim 1, wherein the second semiconductor structure body includes a semiconductor substrate having connection pads, an insulation film which covers the semiconductor substrate and includes opening portions which expose the connection pads, projection electrodes which are formed on the insulation film and are connected to the connection pads via the opening portions, and a first sealing film which covers the insulation film and is formed around the projection electrodes.

6. A semiconductor device comprising:
   an upper circuit board in which a plurality of substrates each including a via-hole and an internal wiring are stacked, the upper circuit board including a plurality of upper-layer wirings on an upper surface thereof and a plurality of lower-layer wirings on a lower surface thereof, the plurality of upper-layer wirings including at least first upper-layer wirings, and the plurality of lower-layer wirings including a plurality of first lower-layer wirings and a plurality of second lower-layer wirings;
   a first semiconductor structure body which is provided on the upper circuit board and is connected to the first upper-layer wirings;
   a lower circuit board which is provided on a peripheral part of a lower side of the upper circuit board, the lower circuit board including a plurality of external connection wirings that are connected to the second lower-layer wirings, and a first opening portion which exposes the first lower-layer wirings and second opening portions which expose the external connection wirings;
   a second semiconductor structure body which is disposed in the first opening portion of the lower circuit board, and which includes external connection electrodes that are connected to the first lower-layer wirings of the upper circuit board; and
   a plurality of conductive solids which are bonded to the external connection wirings via the second opening portions which expose the external connection wirings, each of the conductive solids having a height such that a lower surface of the conductive solid is positioned below a lower surface of the second semiconductor structure body in a state in which the conductive solid is connected to an external terminal;

wherein the second semiconductor structure body includes a semiconductor substrate having connection pads, an insulation film which covers the semiconductor substrate and includes opening portions which expose the connection pads, projection electrodes which are formed on the insulation film and are connected to the connection pads via the opening portions, and a sealing film which covers the insulation film and is formed around the projection electrodes.

7. The semiconductor device according to claim 6, wherein the lower circuit board includes an overcoat film including a plurality of opening portions at parts corresponding to connection pad portions of the external connection wirings.

8. The semiconductor device according to claim 6, wherein the plurality of upper-layer wirings include at least one second upper-layer wiring, and the semiconductor device further comprises a chip component which is electrically connected to the second upper-layer wiring.

9. The semiconductor device according to claim 8, further comprising another sealing film which is provided on the chip component and the upper circuit board.

\* \* \* \* \*